United States Patent
Leitner

(10) Patent No.: US 10,524,393 B2
(45) Date of Patent: Dec. 31, 2019

(54) MULTI-MODULE ELECTRICAL SYSTEM CONTAINING WITH AN INTEGRAL AIR DUCT

(71) Applicant: YouSolar, Inc., Emeryville, CA (US)

(72) Inventor: Arnold Leitner, Emeryville, CA (US)

(73) Assignee: YouSolar, Inc., Emeryville, CA (US)

( * ) Notice: Subject to any disclaimer, the term of this patent is extended or adjusted under 35 U.S.C. 154(b) by 133 days.

(21) Appl. No.: 15/587,139

(22) Filed: May 4, 2017

(65) Prior Publication Data

US 2017/0338689 A1 Nov. 23, 2017

Related U.S. Application Data

(60) Provisional application No. 62/339,530, filed on May 20, 2016.

(51) Int. Cl.
| | |
|---|---|
| *H05K 7/20* | (2006.01) |
| *H02S 40/34* | (2014.01) |
| *H02S 40/30* | (2014.01) |
| *H02J 7/34* | (2006.01) |
| *H02J 7/35* | (2006.01) |

(52) U.S. Cl.
CPC ......... *H05K 7/20572* (2013.01); *H02S 40/30* (2014.12); *H02S 40/34* (2014.12); *H02J 7/34* (2013.01); *H02J 7/355* (2013.01); *Y02P 80/23* (2015.11); *Y02P 90/50* (2015.11)

(58) Field of Classification Search
CPC . G06F 1/20; G06F 1/206; G06F 1/181; G06F 2200/201; G06F 1/263; H05K 7/20145; H05K 7/20154; H05K 7/20163; H05K 7/20736; H05K 7/20172; H05K 1/0203; H05K 7/20209; H05K 7/20745; H05K 7/20809; H05K 7/209; H05K 7/20836; H05K 7/20572; H05K 7/20727; H05K 7/20909; H05K 7/20136
USPC .......... 361/680, 697, 690, 692, 679.48, 688, 361/695, 704, 796; 165/166, 168, 179; 454/184
See application file for complete search history.

(56) References Cited

U.S. PATENT DOCUMENTS

| | | | | |
|---|---|---|---|---|
| 5,335,144 | A * | 8/1994 | Maroushek | .......... H05K 5/0021 165/122 |
| 6,900,387 | B2 * | 5/2005 | Gravell | .............. H05K 7/20727 174/17 VA |
| 2003/0231009 | A1* | 12/2003 | Nemoto | .................. H02J 7/027 323/276 |

(Continued)

*Primary Examiner* — Mandeep S Buttar
(74) *Attorney, Agent, or Firm* — Dorsey & Whitney LLP

(57) ABSTRACT

A system of modules that hold components for operating an external energy source including solar cells and other energy sources is provided, where upon assembly of the modules an electrical cabinet with a module internal air channel for air duct cooling for the components is created. The resulting modular cabinet is only as large as required and is easily expandable. Modules are no larger than the components housed therein and the modules are easy to handle. Interior modules can be in any order reducing the chance of error during assembly and allowing modules in certain positions which may ease installation or operation. Components are thermally connected at the factory to a portion of the air duct in each module and none of the present challenges associated with thermal connection exist at the time of installation.

21 Claims, 17 Drawing Sheets

(56) References Cited

U.S. PATENT DOCUMENTS

| | | | |
|---|---|---|---|
| 2006/0026978 A1* | 2/2006 | Craft, Jr. | H05K 7/207 62/176.6 |
| 2011/0090087 A1* | 4/2011 | Berke | G08B 21/02 340/584 |
| 2011/0304211 A1* | 12/2011 | Peterson | G06F 1/263 307/48 |
| 2013/0088081 A1* | 4/2013 | Siri | H02J 3/383 307/46 |
| 2015/0062819 A1* | 3/2015 | Oughton, Jr. | H01L 23/3672 361/700 |
| 2015/0216075 A1* | 7/2015 | Henkel | H05K 7/1465 361/692 |
| 2017/0034948 A1* | 2/2017 | Hwang | H05K 7/20572 |

\* cited by examiner

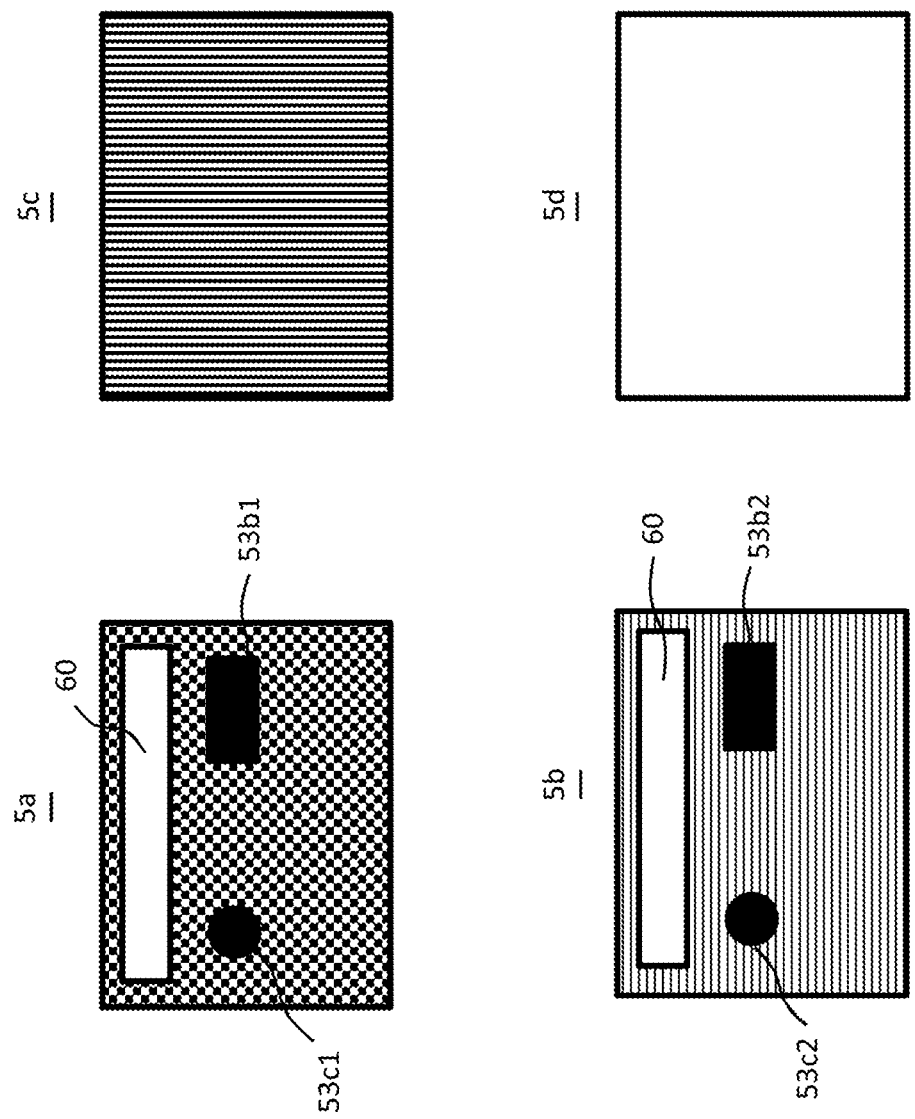

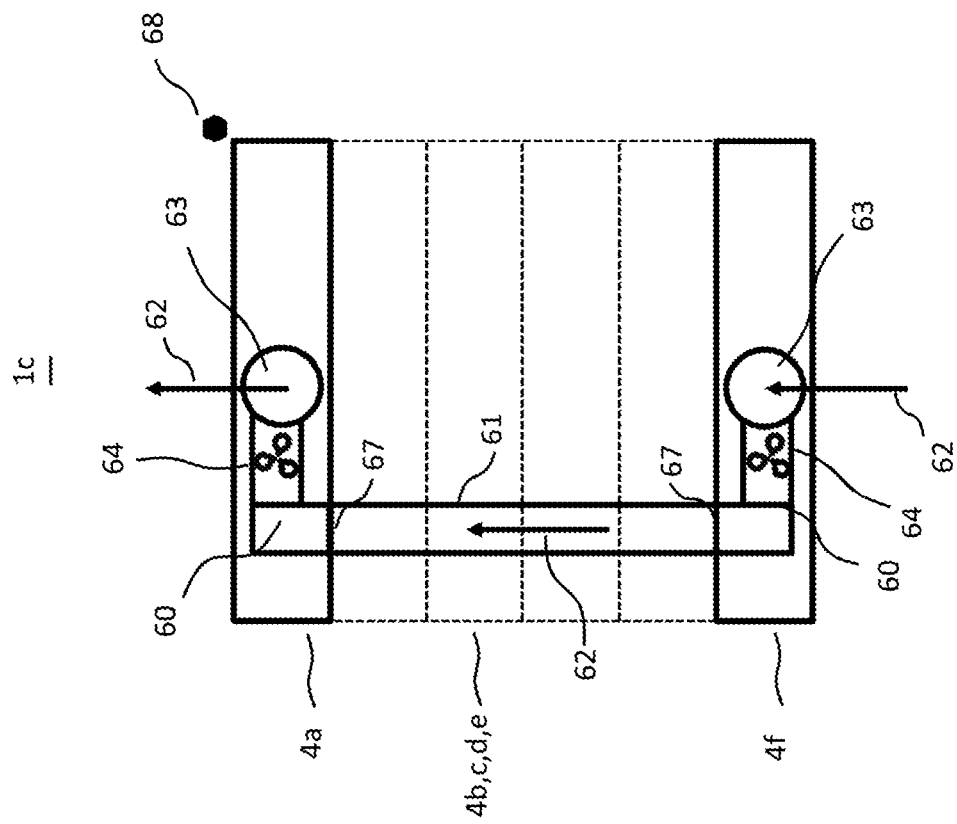
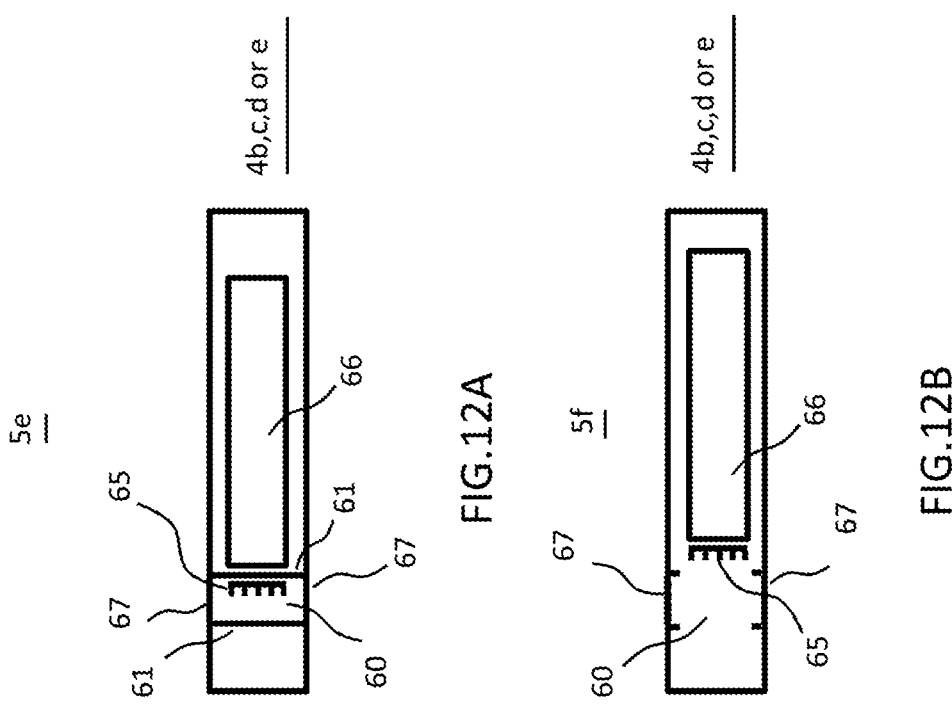

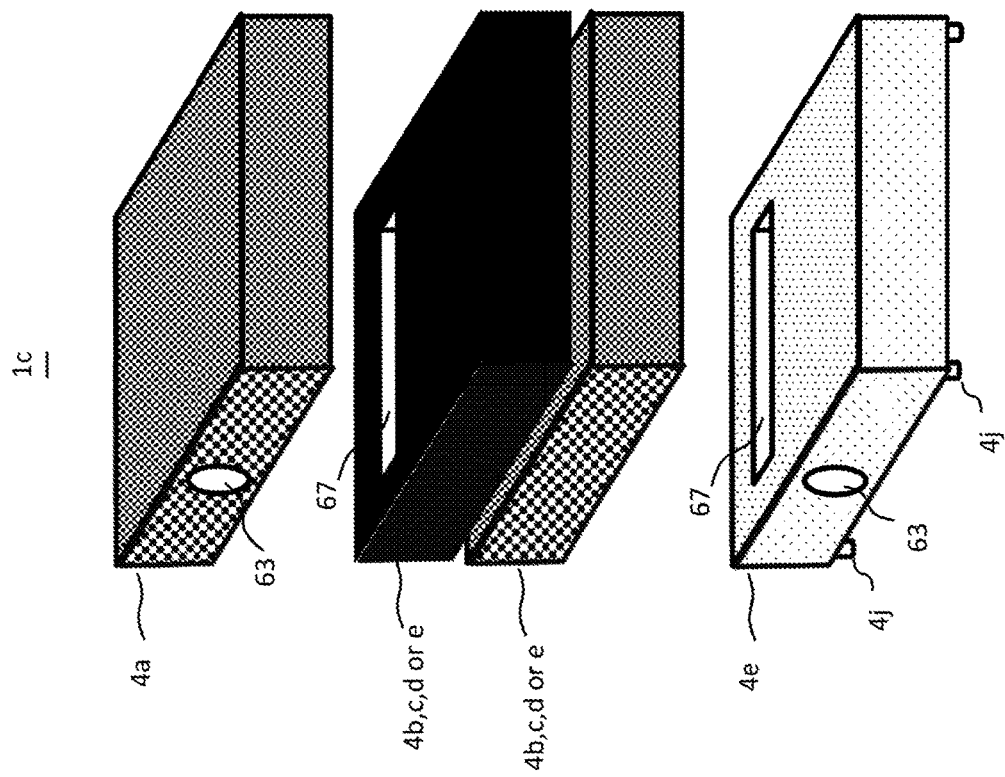

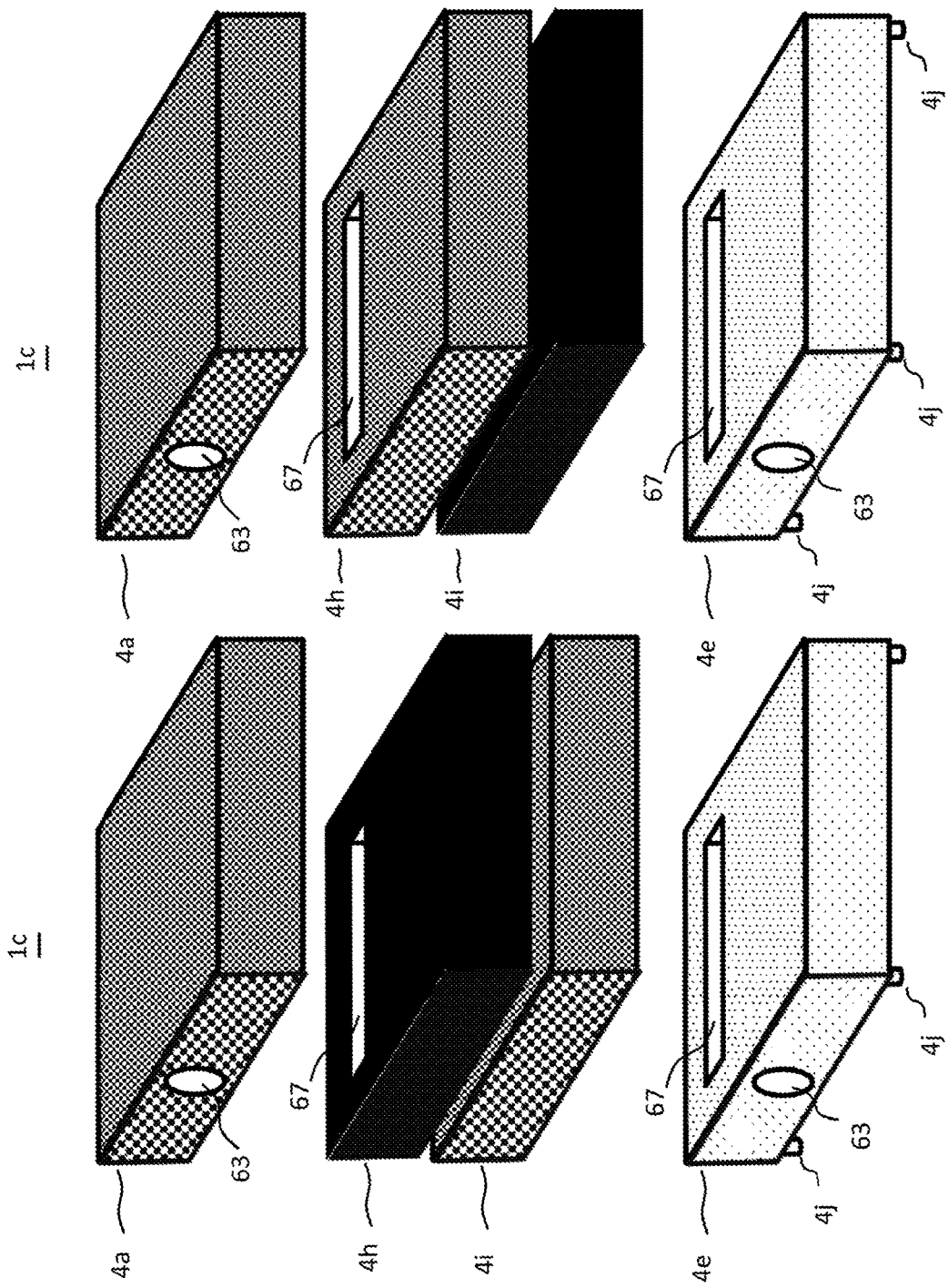

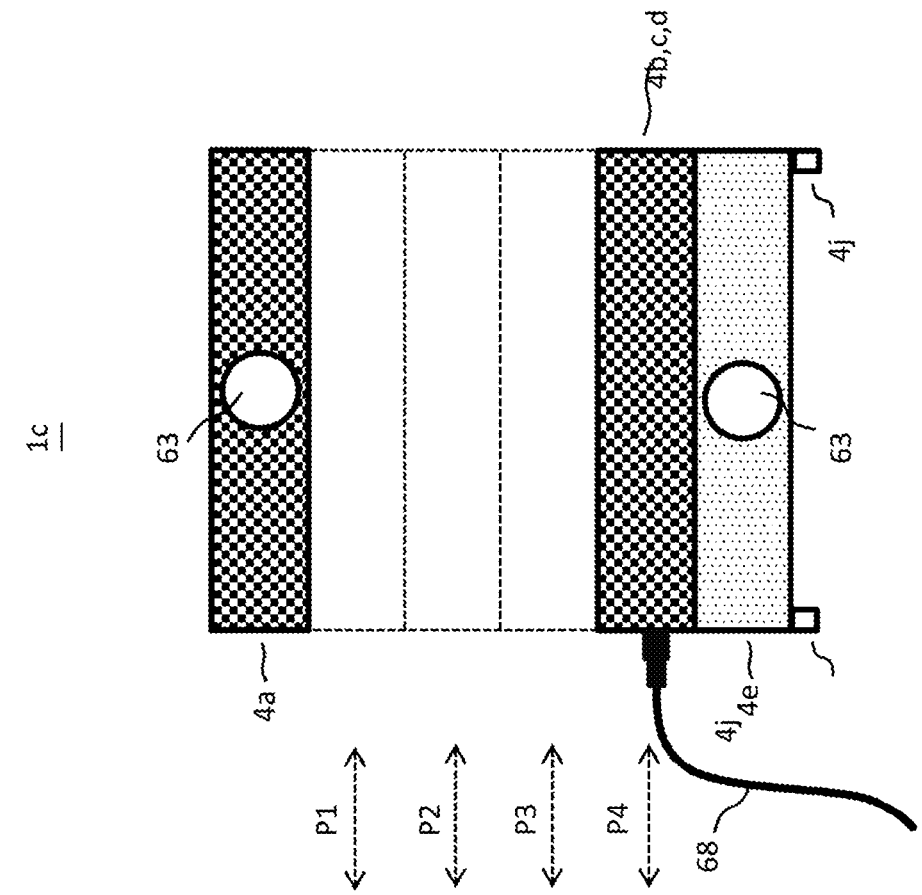
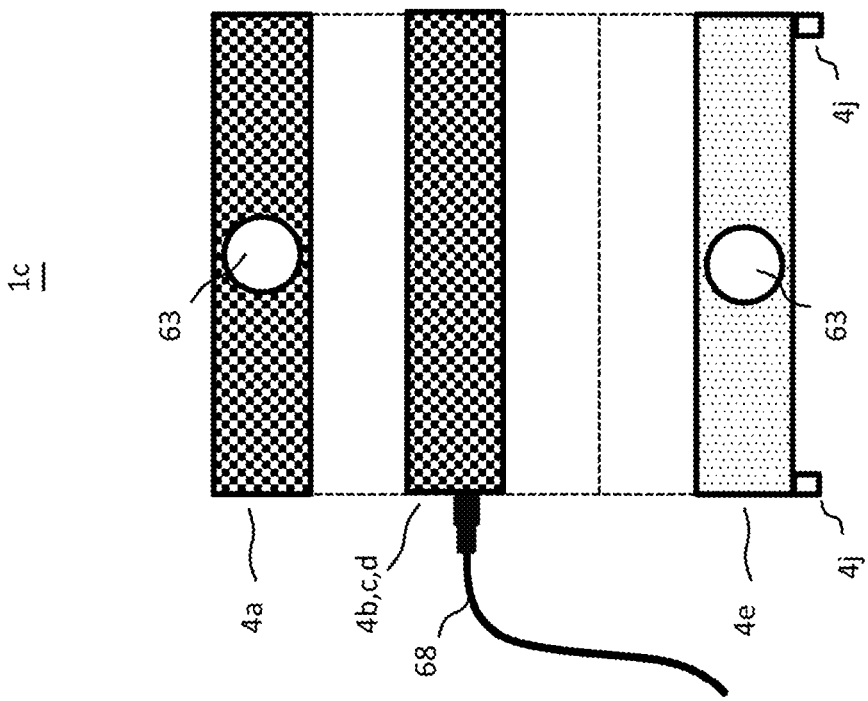
FIG. 17B
FIG. 17A

MULTI-MODULE ELECTRICAL SYSTEM CONTAINING WITH AN INTEGRAL AIR DUCT

CROSS-REFERENCE TO RELATED APPLICATION

This application claims priority of U.S. Provisional Patent Application Ser. No. 62/339,530 filed May 20, 2016, which is incorporated herein by reference.

FIELD OF THE INVENTION

The invention in general relates to an electrical system, and in particular, to a system that is packaged in a compact volume.

BACKGROUND OF THE INVENTION

Solar electrical systems and solar electrical systems with batteries, the latter of which are also referred to synonymously herein as solar-battery systems, have a number of components, illustratively including a solar array, a direct current-to-alternating current inverter ("inverter"), and a battery. Most batteries are added as retro-fits to existing solar systems composed of a solar array and an inverter. In many instances, additional components illustratively include a battery charger or a second inverter for power to and from the battery, respectively, are also included. To connect these different components electrically and safely, conduits and junction boxes are used. Most of these components are in different enclosures connected by conduits and are typically wall-mounted.

However, recently more integrated systems have appeared on the market where some or all of the components are housed in a closed electrical cabinet to avoid the need for conduits and to reduce the footprint of the system. The closed cabinets are either electrical cabinets of the traditional rack type, as shown in prior art FIG. 1A, or are adapted or custom cabinets that use some type of shelf or magazine-style structure, as shown in prior art FIG. 1B.

The closed electrical cabinets are then filled with the required components to create a solar-battery system based on the given application and include an inverter of a certain power rating, at least one battery, and other required components. In the rack-type system of FIG. 1A, components are mounted onto the vertical rails of the rack with screws or pins. The rack-type system is the most common type of electrical cabinet where rails are typically spaced 19 inches (48 cm) apart. The mounted components can be full-width 21, or half-width 22, or of any other fractional size. The situation is similar with shelf or magazine-style cabinets, as shown in FIG. 1B where components fill a full shelf 24, or half-a shelf 26, or any other fraction of the cabinet width.

The electrical components of such prior art racks or cabinets are then connected to one another through a wire harness that provides power, and in some instances communications links between the components. The prior art rack or cabinet is then connected to the solar array, the grid, the electrical load, combination thereof, or possibly other components to form a complete solar-battery systems.

Most electrical components generate so much heat that they must be cooled through convection of air through the cabinet, by heat sinking the components to the outside of the cabinet, or to an air duct passing through the cabinet, but where the air duct is exterior to the cabinet itself. The components of the cabinet can also be cooled by a system that contains a cooling liquid. Cabinets with an air duct that is external to the interior of the cabinet keep the cabinet interior clean of dust and free of moisture and are thus particularly useful. The disadvantage of air duct-style systems is that all components when inserted into the cabinet need to be thermally connected to the air duct. Achieving a reliable and consistent thermal contact when installing components at an end-use site can be difficult.

Most of the aforementioned cabinets are shipped empty in order to save weight, but may include all or part of the cable harness and other components such as the fan, which do not contribute much weight. However, a cabinet holding batteries can exceed safe lifting limits. The specific weight of a lithium-ion battery (with enclosure, battery management system, and other protective and analytic electronics) is in the range of 10-15 kilos per kilowatt-hour. Solar-battery systems designed for residential or small commercial use are typically of the order of 10 kWh, and the system battery weight alone is in the range of 100-150 kg. A solution to the problem of battery weight is thus to "load" the components, especially the batteries, into the cabinet at the site of use.

However, the installation of the components at the site of use makes the use of air duct cooling more difficult, because all components need to make good thermal contact to the air duct. To achieve good thermal contacts, components need to make firm physical contact with the air duct and/or a thermally conductive paste may be applied between the component and the air duct wall. Firm contact is achieved through screws, clamps, and the like.

A fundamental shortcoming of the rack of shelf/magazine-style cabinets is the fact that when shipped to the site the cabinet is a voluminous element with relatively little value per volume. This results in high shipping costs. Large cabinets are also unwieldy to transport and often shippers apply extra cost to voluminous items, which further increases the cost per shipped value. In general, voluminous freight is difficult to handle and is often damaged during transport, which results in returns or delays, and, as a result, customer dissatisfaction.

Yet another shortcoming of a traditional cabinet is that the cabinet must be either sized to hold exactly the number of components needed for the application, or will otherwise contain some empty space. The empty space could be used for expansion of the system, for example for the addition of more batteries, but the finite size of the system also means that the amount of expansion is limited by the size of the cabinet. As a result, offerings from vendors for solar-battery systems include a collection of cabinets to accommodate various system sizes. In addition, at the site of use cabinets that are not fully filled, take up unnecessary space.

The two primary reasons vendors choose a cabinet over components in separate enclosures are that the inside of cabinet conduits can be replaced with a wire harness which is cheaper and simpler to assemble or change, and the second reason is that inside a cabinet a central cooling system can be used—otherwise each component must have its own fan or other passive cooling system.

Thus, there exists and need for an electrical system for a solar installation that overcomes at least one of the aforementioned short-comings of the prior art. There further exists a need for an electrical system that provides improved air cooling of the components in such an electrical system without resort to customization.

SUMMARY OF THE INVENTION

A multi-module electrical system for operating an external energy source includes a set of components and a set of individual stackable modules. The set of components include at least one battery, a direct current (DC) bus, a DC-DC converter in electrical communication between the at least one battery and the DC bus, and an inverter adapted to generate alternating current (AC) from the DC-DC converter. Each of the modules having identical top and bottom connectors and an air duct that forms a continuous air channel in the stack.

BRIEF DESCRIPTION OF THE DRAWINGS

FIG. 11 shows the four types of top and bottom covers of a module according to the present invention.

FIGS. 12A and 12B show two types of designs for the air cooling of a module in accordance with embodiments of the invention;

FIG. 12C shows the design of an air duct for a stack of modules that forms a cabinet in accordance with embodiments of the invention;

FIG. 13 shows a three-dimensional view of the solar-battery system with the apertures of the vertical air duct and one air intake and one air exhaust aperture visible in accordance with an embodiment of the invention;

FIGS. 16A and 16B show a three-dimensional view of an inventive solar-battery system to illustrate how the order of certain modules in the stack can be changed in accordance with embodiments of the invention; and FIGS. 17A and 17B show the solar-battery system with a certain module with an external connection(s) in two different positions in the stack which illustrates how the position of the external connection can be chosen to accommodate spatial needs of where the system is be installed in accordance with embodiments of the invention.

DETAILED DESCRIPTION OF THE PREFERRED EMBODIMENTS

The present invention has utility as modular electrical system that is assembled from a compact component set. Neither the figures nor the following description of various embodiments of the invention are intended to limit the invention to these specific embodiments, but rather to enable any person skilled in the art to make and use this invention through exemplary aspects thereof.

It is to be understood that in instances where a range of values are provided that the range is intended to encompass not only the end point values of the range but also intermediate values of the range as explicitly being included within the range and varying by the last significant figure of the range. By way of example, a recited range from 1 to 4 is intended to include 1-2, 1-3, 2-4, 3-4, and 1-4.

The present invention has utility as a modular set of components that form a functional electrical system as it is assembled. As shown generally at 1c of FIGS. 2 and 3, the system components 4a, 4b, 4c, 4d, 4e1, 4e2, and 4f are housed in enclosures that stack together to form a complete system as described in greater detail hereafter.

Figure 4:
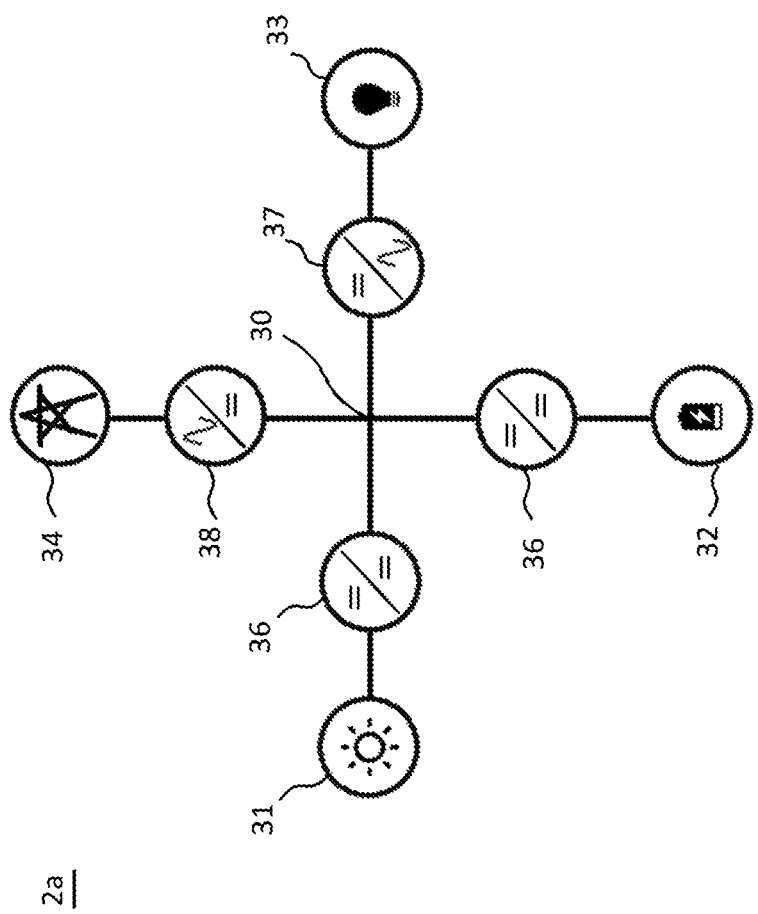
FIG. 4 shows the electrical architecture and the primary components of a solar-battery system based on a direct current ("DC") bus in accordance with embodiments of the invention.
Figure 5:
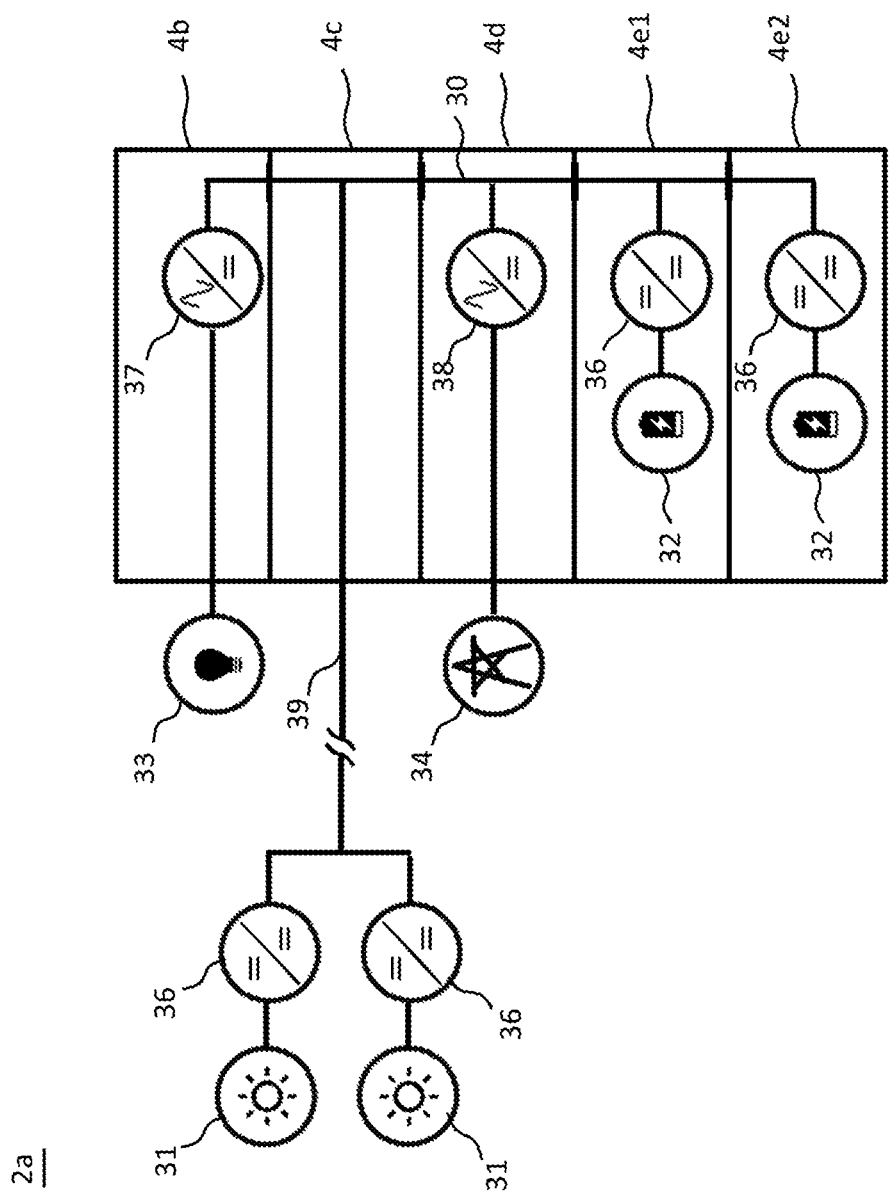
FIG. 5 is based on the solar-battery system of FIG. 4, where the components have been re-arranged and additional components are shown, along with modules of the cabinet which house these components in accordance with embodiments of the invention.

An electrical architecture of a solar-battery system is depicted in FIG. 4. The electrical architecture is based on a high potential that typically ranges from 24 to 760 Volts (V), with 380 V being exemplary of a direct current ("DC") bus. The electric energy from a solar energy source 31 is added to the bus through a DC-DC converter 36. The solar energy source 31 could be one or multiple photovoltaic ("PV") panels. The solar energy source 31 is appreciated to be any source of energy such as wind turbine, generator, or fuel cell, and the term "solar energy source" is intended to encompass these sources of energy as well. The use for DC-DC converters 36 on each PV solar panel or set of PV panels (or other energy sources) allows for a parallel architecture, meaning that additional sources of energy, specifically PV panels, can be added simply by adding them to the bus in parallel. The ability to add PV panels in parallel is shown in FIG. 5. In general, the power architecture based on the DC bus is parallel.

Continuing with FIG. 4, a battery 32 is connected to the DC bus 30 using a DC-DC converter 36. While battery 32 is depicted as a single battery for visual clarity, this depiction is intended to also include multiple batteries. The DC-DC converter 36 typically allows the flow of energy to and from the bus to allow the battery to charge and discharge. Such a DC-DC converter could be a bi-directional DC converter or any other useful topology that achieves the same result. In FIG. 5 two batteries 32 are shown connected to the bus 30 through separate DC-DC converters 36, in a similar manner as discussed earlier for PV panel(s), to demonstrate the parallel nature of the electric architecture.

In addition, FIG. 4 shows further components of a solar-battery system, in particular, the inverter 37, which converters DC to alternating current ("AC") used by the load 33, which for example, includes the electrical appliances of a residence or business, or any other electrical load. FIG. 4 also shows a rectifier 38, which rectifies power from the electrical grid 34, or any other AC power source to DC at the potential of the DC bus, which allows grid power to be added to the DC bus 30.

FIG. 5 shows the same power architecture of a solar-battery system 2a as in FIG. 4 where like numerals have the meaning ascribed thereto with respect to the previous drawings. For illustrative purposes two solar energy sources 31 and two batteries 32 are shown to be connected to the DC bus in parallel. The solar-battery system could also include multiple AC-DC converters 38 connected to the same of multiple AC power sources or multiple DC-AC converters 37 connected to the same or multiple loads 33.

Figure 1:
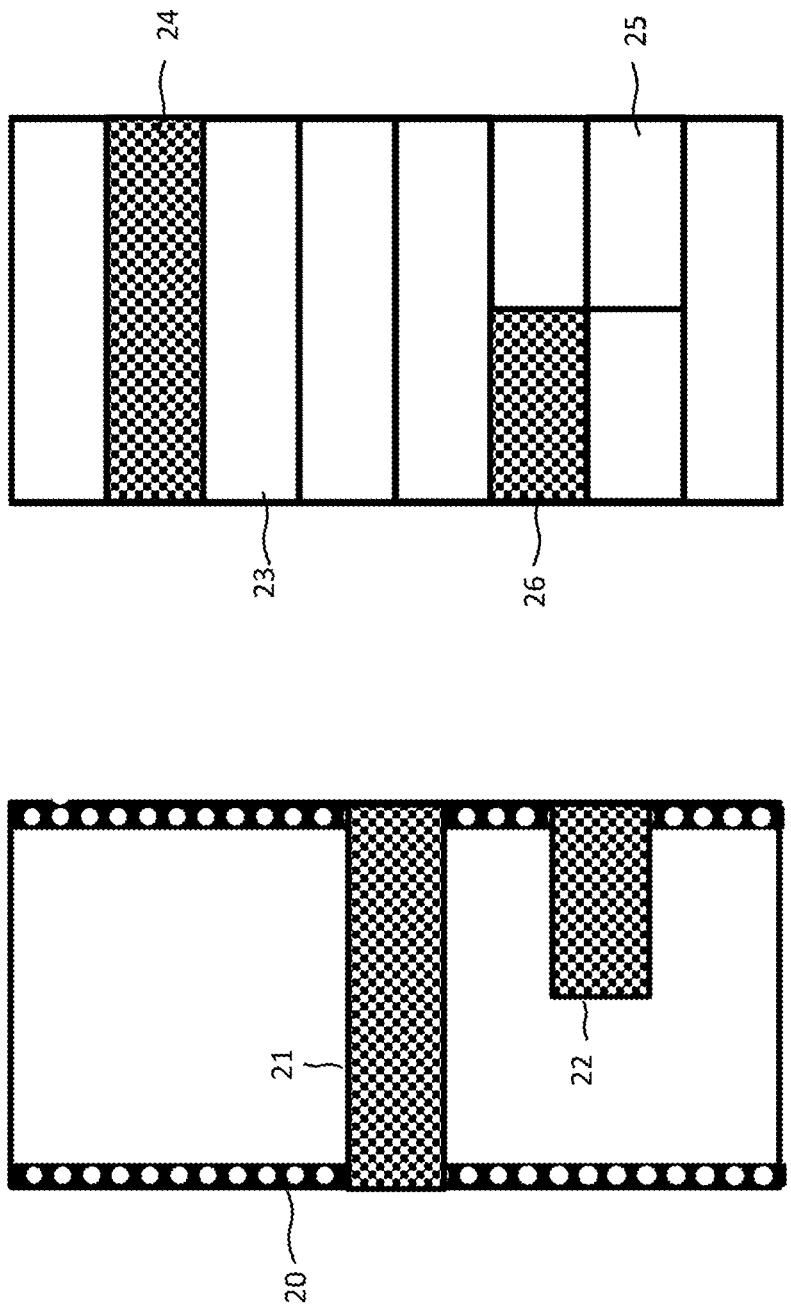
FIGS. 1A and 1B are prior art examples of two electrical cabinets, one based on components mounted to vertical rails, and one based on shelves or magazines, respectively.
Figure 2:
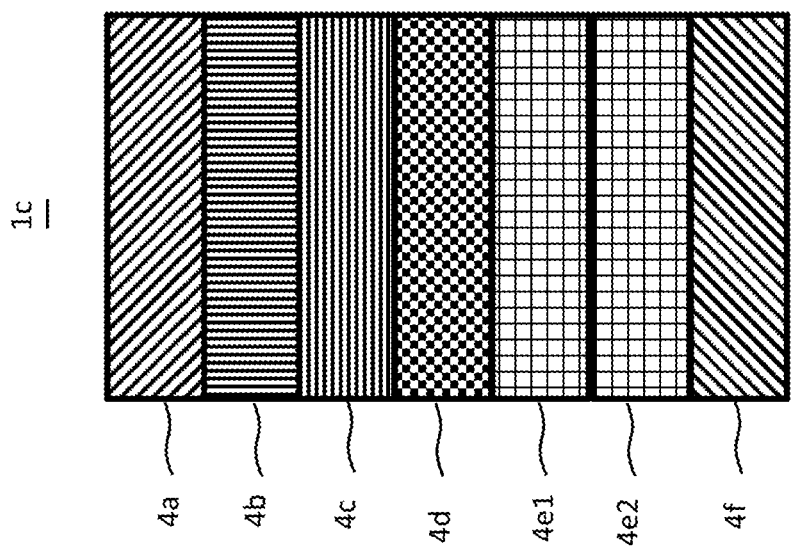
FIG. 2 is a schematic of an inventive solar-battery system made up of a stack of modules that contain electrical components illustratively including an inverter or a battery.
Figure 3:
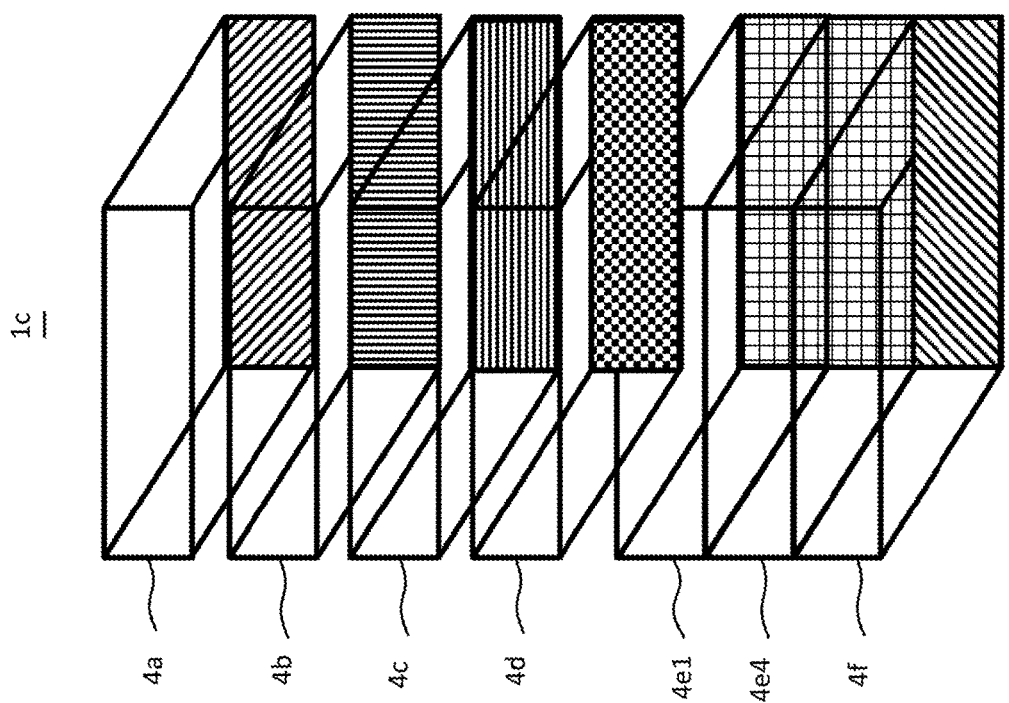
FIG. 3 is based on the schematic of FIG. 2, where some of the modules of the solar-battery system have been separated in accordance with an embodiment of the invention.

FIG. 5 further depicts certain modules: 4b through 4e2, of the solar-battery system 1c of FIGS. 2 and 3. This stack of modules 2a, which is a subset of the solar-battery system 1c, house the inverter(s), rectifier(s), and battery module(s). FIG. 5 also shows a particular inventive embodiment in which the DC-DC converter(s) 36 of the solar energy source are located outside the modules, typically on or near the PV panels 31. The solar energy sources 31 may be added in parallel outside the cabinet and power is connected to the bus 30 with one or more cable(s) 39.

Figure 6:
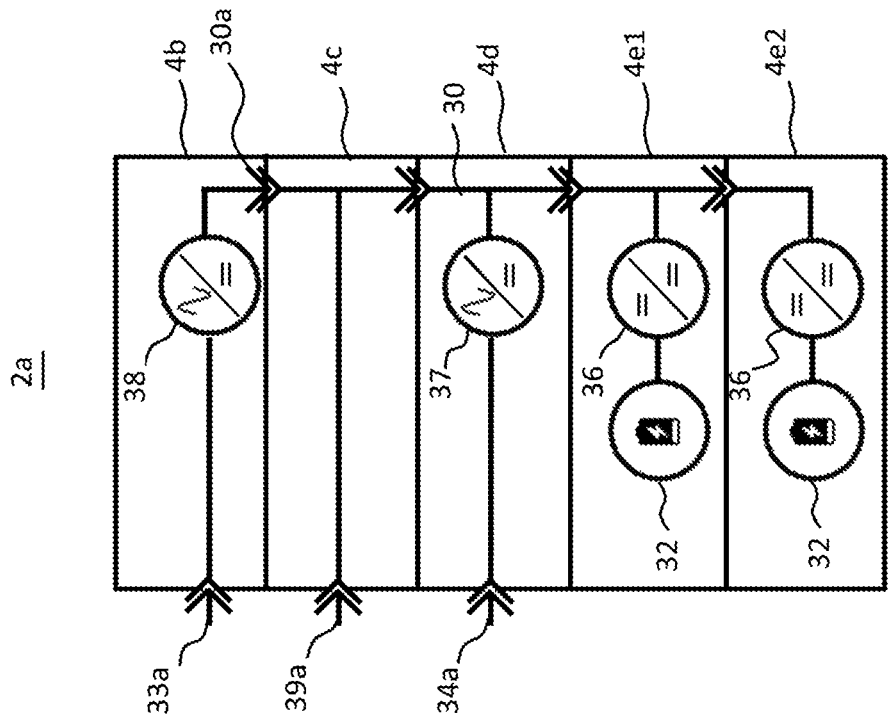
FIG. 6 is based on the solar-battery system of FIG. 4 where components external to the cabinet are no longer shown and connectors to these external components and between modules have been added in accordance with embodiments of the invention.

FIG. 6 again illustrates the stack of modules 2a, where like numerals have the meaning ascribed thereto with respect to the previous drawings; however, with the load 33, solar energy source(s) 31, and the grid 34, not shown for visual clarity. Modules 2a of FIG. 6 are now also shown with connectors (including two parts), 33a of the load(s), 39a of the solar energy source(s), and 34a of the rectifier(s). Also shown are connectors 30a (including two parts) of the high potential DC bus, 30. The modules of 2a in FIG. 6 all have identical top and bottom connectors 30a and can be arranged in a variety of relative positions and with duplicates of any or all components as needed for any given installation.

Figure 7:
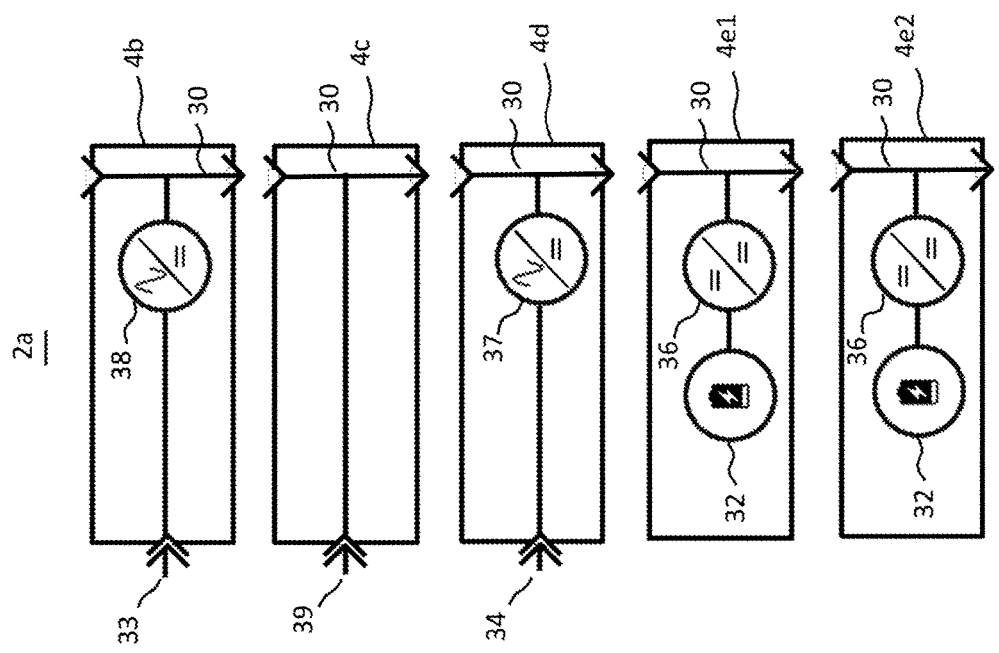
FIG. 7 shows the solar-battery system of FIG. 6 where the modules of the solar-battery system are separated in accordance with embodiments of the invention.

FIG. 7 shows another inventive embodiment, generally at 2a with the modules 4b, 4c, 4d, 4e1, and 4e2, separated, where like numerals have the meaning ascribed thereto with respect to the previous drawings.

Figure 8:
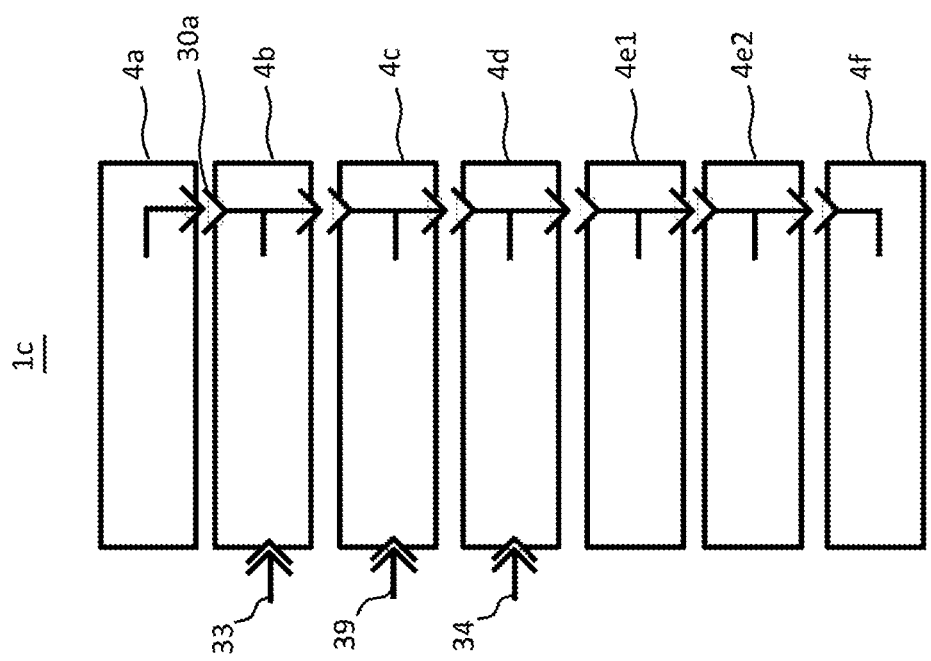
FIG. 8 shows the solar-battery system of FIG. 7 where two additional modules on the top (head) and bottom (base) of the stack of modules have been added and where all modules now have formed the cabinet in accordance with embodiments of the invention.

FIG. 8 shows the entire solar-battery system with modules 4a and 4f added to the top and bottom (or more generally to one and the other end) of the stack of modules 2a, where like numerals have the meaning ascribed thereto with respect to the previous drawings. Modules 4a and 4f, unlike the modules of 2a, may not have matching connectors 30a on both sides of the module (that is the top and bottom) and if so could only be used on the top or bottom of the stack 2a as terminations. Together one module 4a, at least one module 4b through 4e2, and module 4f form a cabinet.

Figure 9:
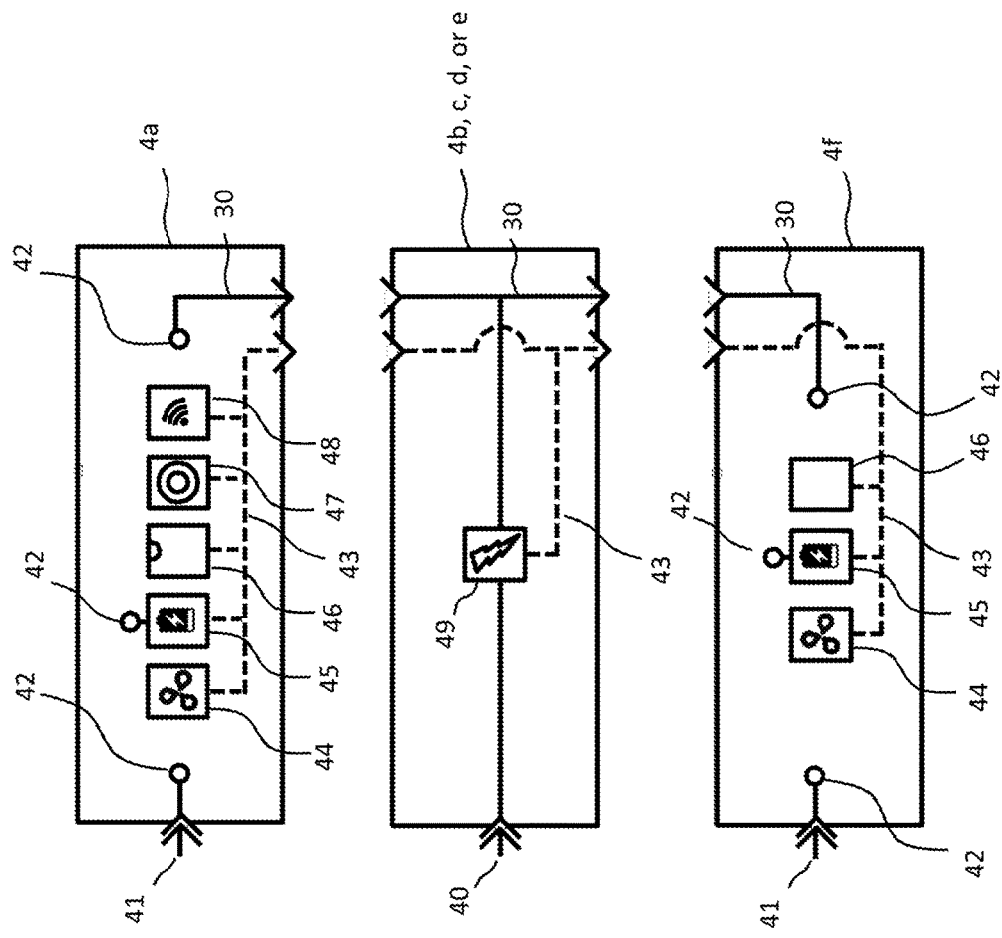
FIG. 9 shows the solar-battery system of FIG. 8 with details of the components in the head and base of the stack of modules, where all other modules are now represented by one generalized module in accordance with embodiments of the invention.

Module 4a serves as the head of the system 1c, and as shown in FIG. 9 head module 4a may contain multiple elements that illustratively include a fan 44; an auxiliary battery 45, a controller 46, a memory 47, a wireless modem 48, or a combination thereof, where like numerals have the meaning ascribed thereto with respect to the previous drawings. Power to the components in the head module 4a may come from the DC bus 30 supplied from an external power source 41, the battery 45, or a combination thereof. It is appreciated that a split connection allows multiple power inputs to simultaneously be in electrical contact to the head 4a. These three sources provide power to some or all of the elements inside the module. Points 42 in the head 4a represent the power supply to the elements. All elements are directly or indirectly connected to this power supply.

The primary power supply to the head 4a in some inventive embodiments comes from the DC bus 30. One or more power conversion devices deliver power to the elements 44, 45, 46, 47, and 48. Alternatively, some or all of the power may come from an external power source 41, but in the solar system considered here the primary source of power is the DC bus 30. The battery 45 provides power to all or some of the components in the module when no power is available from the DC bus 30 (and also when no power is available from the external power supply 41). For example, during a power failure from DC bus 30 (or the external power supply 41), the battery assures that the embedded controller, memory and wireless modem continue to work. The battery in some inventive embodiments is sized so that it can power fan 44, so that the components 4b through 4e2 can be cooled even if there is no power on the DC bus 30, which here is assumed to be the only power supply other than the battery 45. This situation would occur when the system powers down, but the modules must be cooled for a certain time after they are powered down. In some inventive embodiments, a thermal sensor controls a fan switch to assure cooling to a preselected temperature upon shutdown.

A communications network 43 is also shown in FIG. 9. The communications network 43 connects to some or all elements in the solar-battery system. The communications network 43 in some embodiments, as shown here as separate wires and connectors may be combined with the cables and connectors of the DC bus; run on the DC bus using power line communication technology; be wireless, or by any other means of communication. Also, shown in FIG. 9, a power component 49 is shown in module type 4b through 4e2. The power component 49 may represent any of the power components of the aforementioned modules. Connector 40 represents one or many connectors for power input and output, including solar 31, the grid 34, the load 33 (or another external power source).

Module 4f is the base of the solar-battery system and together with the modules 4b through 4e2 completes the system 1c. The base may contain a fan 44, a battery 45, and any other element 46. Module 4f may have an external power supply 41. Power is supplied by the power supply system 42.

Figure 10:
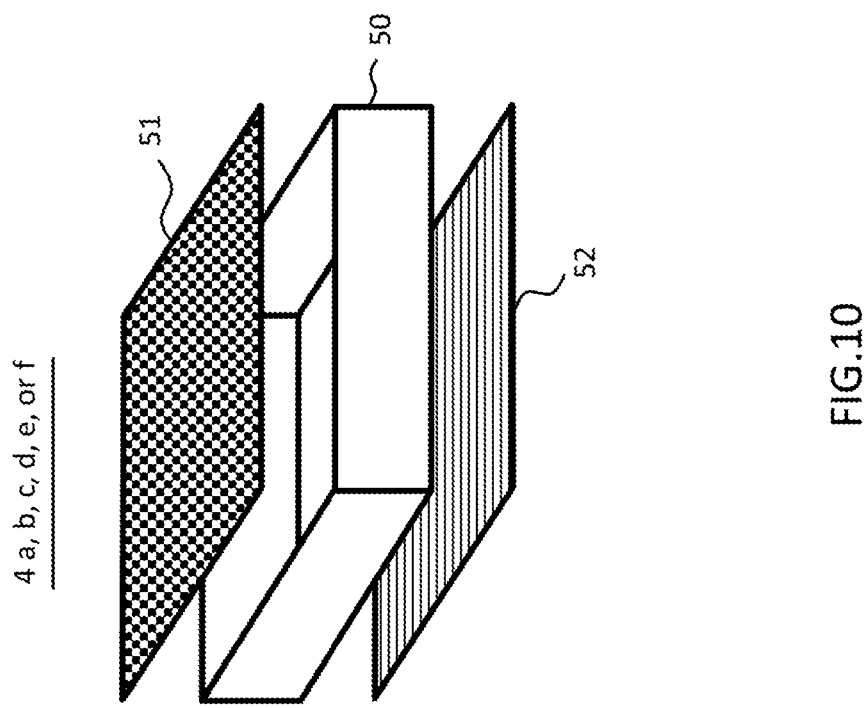
FIG. 10 shows the primary exterior parts of a module including side walls, top plate, and bottom plate in accordance with embodiments of the invention.

Each module, 4a through 4f, include the walls 50 and the top cover 51 and bottom cover 52 as shown in FIG. 10, where like numerals have the meaning ascribed thereto with respect to the previous drawings.

There are two types of top covers 51 and bottom covers 52. In FIG. 11 5a is a top cover and 5b the bottom cover of an "interior element", 4b through 4e2, where like numerals have the meaning ascribed thereto with respect to the previous drawings. Both 5a and 5b have an opening that is part of an air duct 60. The top cover 5a and bottom cover 5b also have communication connectors 53c1 and 52c2 and DC bus connectors 53b1 and 53b2. These are mating connectors and top plates only have connectors 53c1 and 53b1 and bottom plates have connectors 53c2 and 53b2. Also, shown in FIG. 11 are the top cover of the head 5c, and the bottom cover of the base 5d.

In FIGS. 12A and 12B are two different embodiments of an interior module 5e and 5f are shown, where like numerals have the meaning ascribed thereto with respect to the previous drawings. In 5e the aperture 67 of the opening 60 leads into an air duct 61. Air entering the air duct 61 flows over a heat exchanger 65 that cools the component 66, which is thermally connected to the heat exchanger 65. In the embodiment 5e air never enters the interior of the interior module. This is the design concept of an air duct. In the embodiment 5f, air enters and exits through the apertures 67, but here air flows into the interior of the module. The embodiment 5e may be chosen, because it creates a module that is hermetically sealed from the outside (although the module may have some opening to allow air pressure inside the module to equilibrate with the pressure of the ambient air).

FIG. 12C shows the solar-battery system 1c, where like numerals have the meaning ascribed thereto with respect to the previous drawings. The openings 60 and the air duct 61 create a path for air to flow through the entire system 1c. For example, air 62 enters into the aperture 63 of the base module 4f and is forced upward by fan 64 into the stack of modules and exits from aperture 63 of the head module 4a. The fan 64 may alternatively be located in the head or there may be fans in both the base and head to move air 62 through the air duct 61.

FIG. 13 shows a three-dimensional drawing of the solar-battery system 1c, but only two interior modules are shown for clarity, where like numerals have the meaning ascribed thereto with respect to the previous drawings. The drawing of 1c in FIG. 13 illustrates how the apertures 67 of the air duct 61 align. Also, shown here are feet 4j of the base 4e.

Figure 14A:
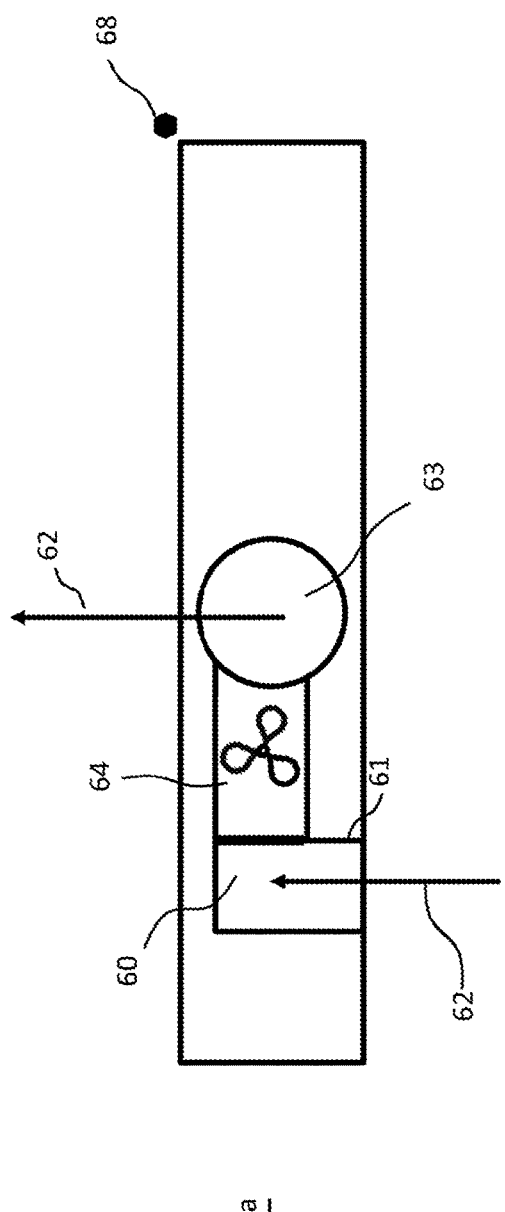
FIGS. 14A and 14B show two cross sections of an inventive head module showing an example of an air duct design in the head in accordance with embodiments of the invention.
Figure 14B:
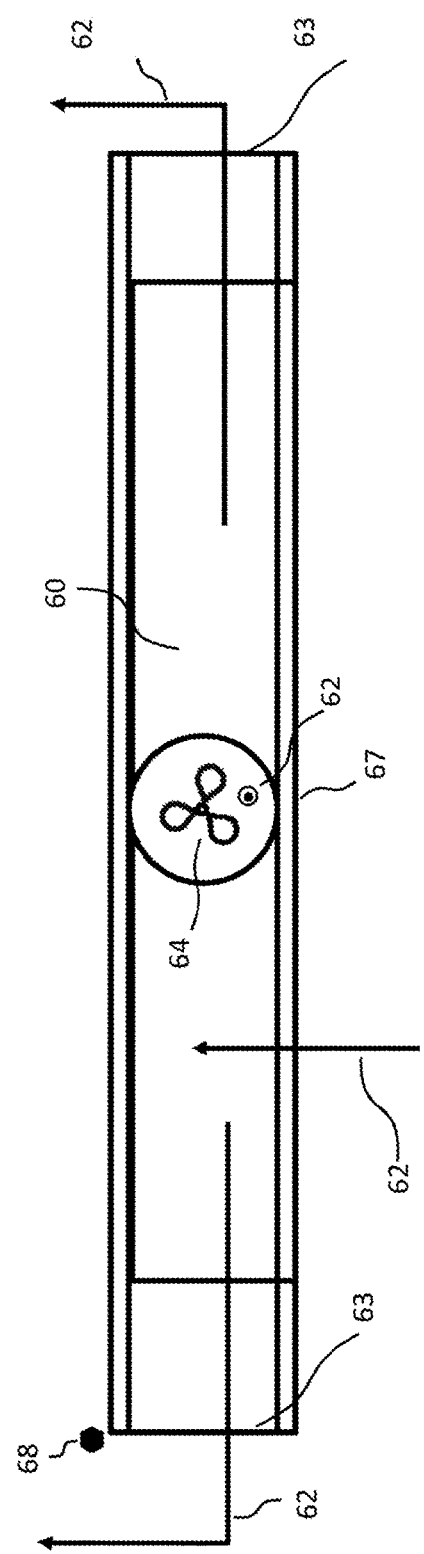

FIGS. 14A and 14B show two cross sectional views of the head 4a to show a possible design of the entire air duct of the head 4a, where like numerals have the meaning ascribed thereto with respect to the previous drawings. The air duct in the base may be similar. In this embodiment air 62 exits both sides of the head 4a through two circular apertures 63 that run in two ducts to the middle of the module where they connect with a duct perpendicular to the aforementioned ducts. This perpendicular duct holds the fan 64 which pushes/sucks the air through a slot like air duct that runs vertically through the stack. Many other embodiments are possible. The dot 68 serves to mark the orientation of the head 4a in FIGS. 14A and 14B.

Figure 15:
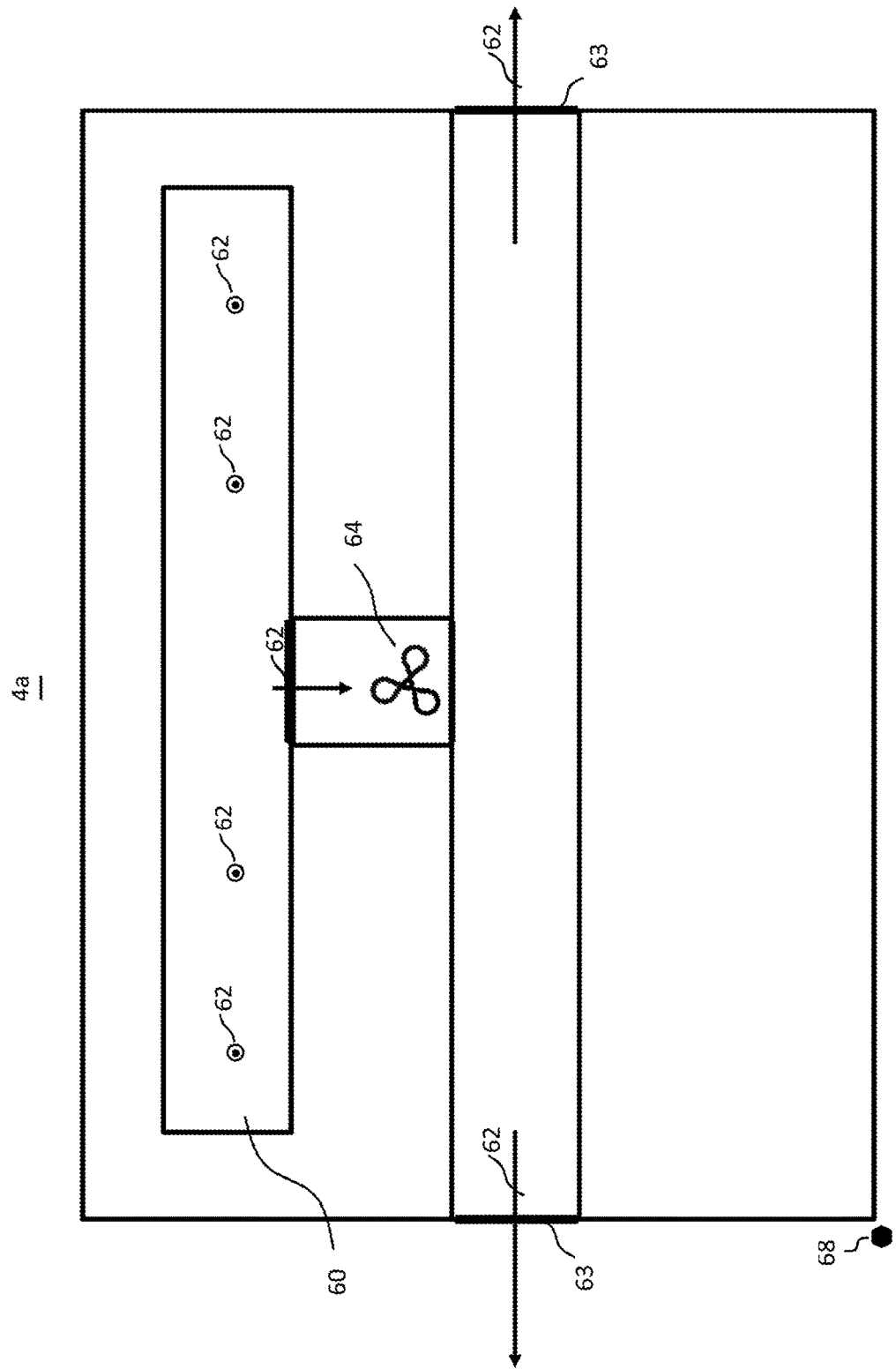
FIG. 15 shows a cross section of the head module showing the example of an air duct design in the head of FIGS. 14A and 14B in accordance with embodiments of the invention.

FIG. 15 shows an embodiment of the air duct in the head shown in FIGS. 14a and 14b, which feature one aperture 63 on each side of the head or base, where like numerals have the meaning ascribed thereto with respect to the previous drawings. Air 62 flowing upwards through the vertical path of the air duct is moved by the fan 64 into the part of the air duct leading to the apertures 63.

FIGS. 16A and 16B show the solar-battery system 1c but only two interior modules 4h and 4i are shown; 4h and 4i could be any of the modules 4b through 4e2, where like numerals have the meaning ascribed thereto with respect to the previous drawings. FIGS. 16A and 16B illustrate that the design of the interior modules (and that of the head and base module) allows the module 4h and 4i to be arrange in any order. This means that during the assembly of the system the interior modules can be installed in any order. With no required order of modules, assembly errors can be avoided. However, it is advised that during an installation that the heavy battery modules be put at the bottom of the module stack to lower the center of gravity. However, in principle any danger of tipping of the system 1c is much reduced, because unlike in the cabinet designs 1a and 1b the cabinet scales in height with the number of modules, and only 2 or 3 modules will be lighter weight (holding inverters or rectifiers) as compared to the battery modules which can number 1-10 (or more) modules.

FIGS. 17A and 17B show another advantage of the modular cabinet design of embodiments of the invention, where like numerals have the meaning ascribed thereto with respect to the previous drawings. FIGS. 17A and 17B show the system 1c with an interior module with an external connection 68 in two different positions (p2, p4) of positions p1 through p4, of the stack of the system 1c. The ability to choose the position of an external connection 68 to match up with the physical constraints at the site of use is another convenient feature of embodiments of the invention. For example, a hole in a wall at an installation site may make it particularly useful if the connection 68 was located in position p2 rather than in position p4.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the described embodiments in any way. Rather, the foregoing detailed description will provide those skilled in the art with a convenient road map for implementing the exemplary embodiment or exemplary embodiments. It should be understood that various changes may be made in the function and arrangement of elements without departing from the scope as set forth in the appended claims and the legal equivalents thereof.

The invention claimed is:

1. A multi-module electrical system for operating an external energy source, the system comprising: a plurality of components that in operation generate excessive heat, and a plurality of individual stackable modules comprising the plurality of components, each of the plurality of modules having an air inlet and an air outlet, wherein the air inlets and air outlets of the plurality of modules are aligned to form a continuous air channel configured to pass air through each of the plurality of modules to remove the excessive heat generated by the components of each of the plurality of modules, and wherein each of the plurality of modules includes one or more electrical connectors for electrically coupling the modules together wherein the continuous air channel is provided by an air duct, passing through the stack, each of the plurality of modules forming a portion of the air duct between respective air inlet and air outlet of the module, and wherein the components of the individual modules are separated from air flow through the air duct by walls of the air duct, the components being thermally coupled to the walls of the air duct.

2. The system of claim 1, wherein the plurality of components comprises at least one of a battery, an inverter, and a rectifier.

3. The system of claim 1, wherein each of the individual stackable modules comprises an enclosure, which houses the components of a given module, and wherein a stack of the enclosures forms a cabinet.

4. The system of claim 1 further comprising at least one fan fluidly coupled to the continuous air channel.

5. The system of claim 4 further comprising a fan battery configured to power the at least one fan.

6. The system of claim 4 further comprising a thermal sensor configured to control the at least one fan for cooling the modules to a preselected temperature upon shutdown of the system.

7. The system of claim 4, wherein the at least one fan is located in a top one of the plurality of modules or a bottom one of the plurality of modules.

8. The system of claim 1, wherein at least one of the plurality of modules further comprises at least one of a controller, a memory, a wireless modem, or a combination thereof.

9. The system of claim 1, wherein at least one of the plurality of modules is powered by power inputs from an external power source, a battery, or a combination thereof.

10. The system of claim 9 further comprising a split connection that allows multiple power inputs to simultaneously be in electrical contact to the at least one of the plurality of modules.

11. The system of claim 1, wherein the external energy source comprises at least one of a solar energy source, a wind turbine, a generator, or a fuel cell.

12. The system of claim 1, wherein the external energy source comprises one or more photovoltaic ("PV") panels or sets of RV panels.

13. The system of claim 1, wherein the plurality of components comprises: at least one battery, a direct current (DC) bus, and a DC-DC converter in electrical communication between the at least one battery and the DC bus.

14. The system of claim 1, wherein the plurality of components comprises a direct current (DC) bus and an inverter adapted to generate alternating current (AC) from the DC bus.

15. The system of claim 12 further comprising a plurality of DC-DC converters, one each on each of said one or more PV panel or said set of PV panels for a parallel architecture that adds said external energy sources in parallel to a DC bus.

16. The system of claim 1, wherein the plurality of components comprises two or more batteries connected in parallel.

17. The system of claim 1, wherein the plurality of components comprises at least one battery, a direct current (DC) bus, and a DC-DC converter in electrical communication between the at least one battery and the DC bus, and wherein the DC converter is bi-directional.

18. The system of claim 1 further comprising a communications network.

19. The system of claim 18 wherein said communications network is at least one of separate wires and connectors combined with a set of cables and connectors of a DC bus; run on said DC bus using power line communication technology; or wirelessly.

20. The system of claim 1, wherein the plurality of modules includes at least three modules and wherein the air inlet and outlet of a middle one of the three modules are vertically aligned such that the continuous air channel is oriented vertically in at least the middle module when the three modules are stacked.

21. The system of claim 1, wherein the electrical connectors are identically positioned on at least two of the plurality of modules such that the least two of the plurality of modules can be interchangeably ordered within the stack.

* * * * *